Nov. 26, 1935. D. E. HARNETT Re. 19,765

RADIORECEIVER

Original Filed Dec. 14, 1931

INVENTOR
DANIEL E. HARNETT
BY
Pennie, Davis, Marvin and Edmonds
ATTORNEYS

Reissued Nov. 26, 1935

Re. 19,765

UNITED STATES PATENT OFFICE 19,765

RADIORECEIVER

Daniel E. Harnett, Tuckahoe, N. Y., assignor to Hazeltine Corporation

Original No. 1,962,104, dated June 5, 1934, Serial No. 580,871, December 14, 1931. Application for reissue October 3, 1935, Serial No. 43,390

21 Claims. (Cl. 250—20)

Figure 2:
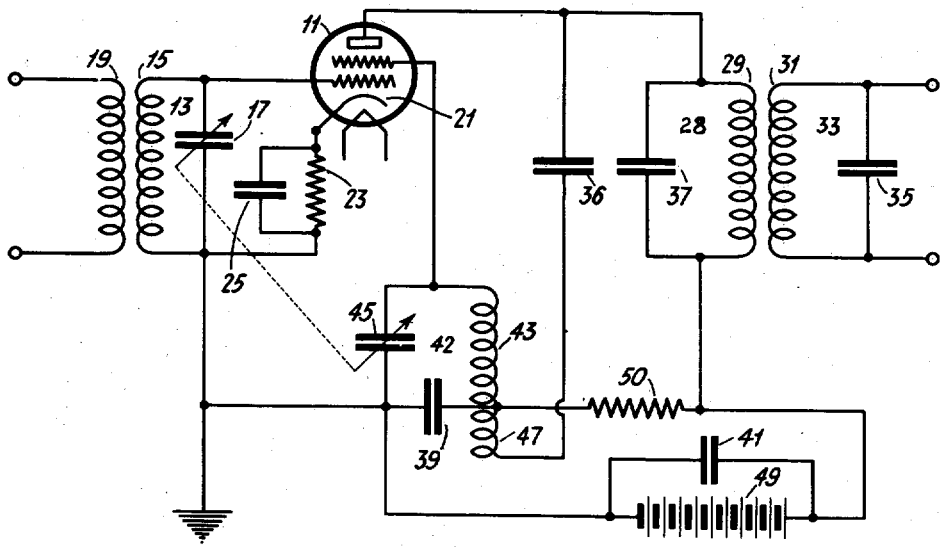

The present invention relates to an oscillator modulator, and, more particularly, to oscillator modulators for use in connection with superheterodyne radio receivers.

In a superheterodyne receiver the signal or carrier frequency is converted into a fixed intermediate frequency which may be amplified readily by specially designed amplifiers with practically uniform results regardless of the frequency of the received signal. It is the usual practice to beat or modulate the incoming signal currents with locally produced currents of a frequency differing from the frequency of the received signals by an approximately fixed amount. This difference frequency is that to which the intermediate-frequency amplifiers are adapted to respond.

It has been proposed to use a single thermionic tube for the purposes of producing the locally generated oscillations and modulating the incoming signal currents. However, as the frequency to which the receiver and oscillator circuits are tuned varies through a broad band, it is difficult to produce an oscillator modulator which will have sufficient output at all points within its tuning range and not have an output at some particular point which will result in overloading the grid circuit and thus cause the grid to draw current, the effect of which is to reduce the selectivity of the radio-frequency input circuit, and cause cross-modulation between the desired and strong interfering signals.

It is the principal object of the present invention to produce an oscillator-modulator arrangement which will have a substantially uniform translation gain throughout the entire tuning range.

It is a supplementary object of this invention to produce an oscillator-modulator circuit in which the grid circuit of the modulator shall be free from overloading at any point within the tuning range in order to prevent loss of selectivity.

It is a still further object of the present invention to produce an oscillator-modulator arrangement in which the oscillating current is supplied to the modulator tube in such a manner as to prevent the grid drawing current, which would lessen the selectivity of the tuned grid circuit, and prevent other overloading effects.

These and further objects of the present invention will become apparent from the following specification when considered in connection with the accompanying drawing.

In accomplishing the objects of the present invention, the oscillator modulator is provided with a uniform-gain oscillatory circuit so that the voltage output of said circuit, which effects the grid circuit to produce the modulation of the received signals, will be substantially uniform throughout the tuning range of the oscillator. In other words, a uniform-gain type oscillator permits the oscillator current to be limited to such a point that it does not paralyze the tube, and it is possible therefore to utilize it as an efficient detector.

A uniform feed-back between an output electrode of the oscillator-modulator tube is obtained by combining electromagnetic and electrostatic couplings in the proper phase so that a gain in the electromagnetic coupling is offset by a decrease in the electrostatic coupling, and vice versa, as the circuit is tuned. The capacitive coupling may be obtained by a fixed condenser constituting a portion of the oscillation circuit. This condenser may have the dual function of assisting the alignment of the oscillation circuit with the input radio-frequency circuit to permit uni-control of these two circuits by the same control element.

The oscillation circuit may be excited either from the plate or screen-grid electrodes by the use of appropriate connections.

Preferably, the oscillation circuit is electromagnetically coupled to an inductance placed in the cathode lead of the modulator tube, by which it is meant that it is in a circuit which is common to the plate and grid circuits of the tube. In this event, the coupling is so chosen that the maximum voltage fluctuation of the grid relative to the cathode will be insufficient to cause the grid to swing positive so as to draw current.

Alternatively, the oscillation circuit may be coupled to the plate circuit for excitation purposes and connected to an auxiliary grid of the tube for the purpose of varying the electron stream in the tube in accordance with the oscillation frequency and thus modulating the signal frequency impressed upon the grid circuit of the modulator. In this event, there is little danger of overloading the tube and no danger at all of causing the control grid to draw current, which would decrease the selectivity of the input circuit.

The cathode circuit may also include a self-biasing resistor for maintaining the proper bias on the grid relative to the cathode, and if the value of this resistor is properly chosen, it may be caused to act as a regulator to prevent the modulator from overloading, as will be described hereinafter.

Figure 1:
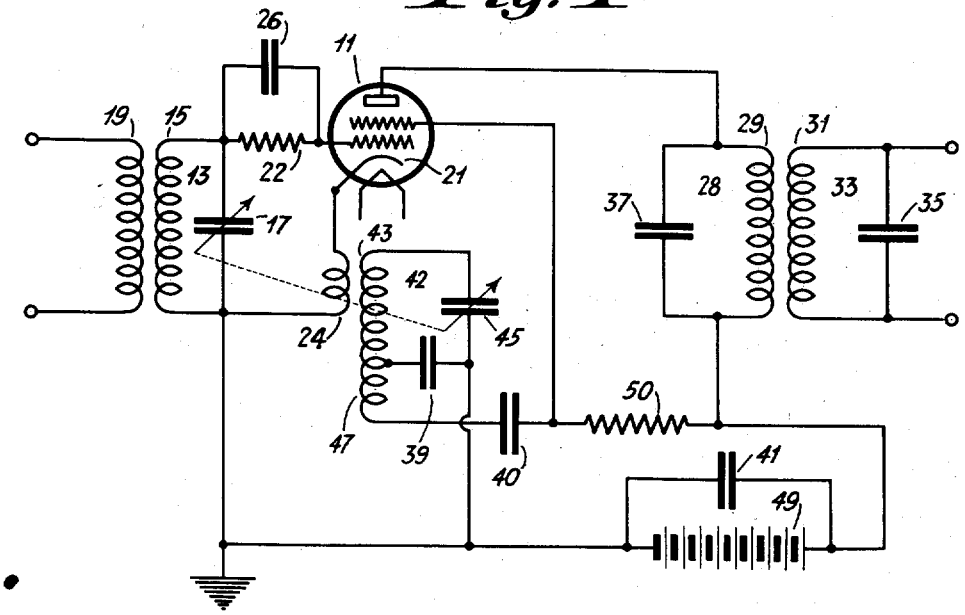

Attention is now invited to the drawing, in which:

Fig. 1 is a circuit showing an oscillator modulator arranged to oscillate between screen-grid and cathode; and Fig. 2 is a similar circuit arranged to oscillate between plate and screen-grid.

Referring now more particularly to Fig. 1, a thermionic oscillator tube 11 is connected, as shown, to a tuned input circuit 13, which includes inductance 15 and variable condenser 17. Inductance 15 may be inductively coupled to the inductance 19, which may be the output inductance of a radio-frequency amplifier or the antenna inductance of a receiver. The tuned grid circuit 13 is connected between ground and the grid of the tube 11 through the usual grid-leak 22 shunted by condenser 26 for the purpose of producing grid modulation in the tube 11, the grid-leak 22 and the inductance 15 providing a conductive connection between grid and ground.

The output circuit of the tube 11 comprises an output inductance 29, tuned by means of the adjustable condenser 37 to the intermediate frequency, and the high potential source 49. The condenser 37 and a condenser 41 shunting the source 49 are effective to by-pass high-frequency currents; that is, they provide a path to ground of negligible impedance to currents of signal or oscillation frequencies. The inductance 29 is inductively coupled to inductance 31, included in the circuit 33, tuned by means of condenser 35 to be resonant to the intermediate frequency. This circuit may be connected to an intermediate-frequency amplifier tube, which is not shown.

The oscillation circuit 42 includes the inductance 43, the adjustable condenser 39, and the variable condenser 45. This circuit is coupled to the screen-grid circuit by means of the dual couplings provided between the inductance 47, included in said circuit, and the inductance 43, and the condenser 39, which is common to the screen-grid and oscillation circuits.

For supplying the high voltages, there is provided the usual battery 49 connected through the inductance 29 to the plate of tube 11. The screen-grid voltage is shown as being supplied by the connection to the battery 49 through the isolating resistor 50. The specific means for supplying the screen and plate voltages constitute no part of the present invention, however, and any appropriate method of voltage supply may be utilized.

The screen-grid circuit includes the screen-grid, the condenser 40, inductance 47, and the condenser 39.

The signal input circuit 13 and the oscillation circuit 42 are tuned simultaneously by a uni-control arrangement of condensers 17 and 45. These tuned circuits are designed to have resonant frequencies differing by an amount substantially equal to the intermediate frequency. The oscillation frequency is preferably the higher. The two tuning condensers 17 and 45 generally have the same capacity variation. The oscillation frequency is made higher by making the inductance 43 of lower inductance than coil 15. With this change alone the frequency difference would vary in proportion to the resonant frequency of the signal input circuit. Therefore, the difference at higher signal frequencies is decreased by making the effective minimum capacity of condenser 45 and its associated circuits slightly greater than that of condenser 17 and its associated circuits. Likewise, the difference at lower signal frequencies is increased by inserting the fixed condenser 39 in series with the condenser 45. By proper choice of the oscillator elements 45, 39 and 43 relative to the signal circuit 13, the frequency difference is made exactly equal to the intermediate frequency at three points in the tuning range. This is called the alignment of signal and oscillation circuits to secure the intermediate-frequency difference. Padding condensers may be provided in parallel with either or both of the condensers 17 and 45 in order to permit adjustments for assisting in the alignment of the circuits 13 and 42.

The inductance 43 is inductively coupled to the cathode inductance 24 for supplying the oscillation voltages to the input circuit of tube 11.

Although the resistance 22 and condenser 26 are shown as being included in the grid lead, they may, if desired, be included in the cathode lead instead, as shown in Fig. 2.

The operation of the circuit of Fig. 1 is as follows: The input circuit 13 is tuned to the incoming signal frequency and impresses upon the grid of the tube 11 a potential varying relative to the potential of the cathode 21 in accordance with the incoming signal. The resistance 22 and the condenser 26 are so arranged as to permit grid modulation of the incoming signal by means of the oscillation voltage which is supplied from the oscillation circuit to the cathode of the modulator 11. The oscillation voltage impressed upon the cathode of tube 11 serves to vary the relative potentials of the grid and cathode in accordance with the oscillation voltage. The tuned plate circuit 28 is adjusted to respond to the difference frequency, which is one of the components present in the output of the modulator 11.

The screen-grid is utilized for supplying energy to the oscillation circuit, the coupling between the screen-grid and the oscillation circuit being the dual couplings provided by the inductance between inductances 47 and 43 and the capacity of condenser 39. The inductive coupling is so arranged that it will increase with an increase in the frequency oscillations; whereas the impedance of the condenser 39 being less at high frequencies, the electrostatic coupling will decrease. The electromagnetic coupling, on the other hand, decreases at the low frequencies, and the impedance of the condenser 39 increases at the low frequencies. Thus, a substantially uniform coupling between the output or screen electrode may be provided which will cause a substantially uniform voltage to be produced by the oscillation circuit 42 regardless of the frequency to which it is tuned.

Whereas Fig. 1 shows a circuit in which the oscillation circuit is excited by means of the screen-grid, it is obvious, of course, that this excitation may be from the plate circuit if desired.

An alternative means of accomplishing the principal object of the present invention is illustrated in Fig. 2, to which attention is now invited. In this figure, in which like parts are designated by similar reference numerals, the modulator 11 has a tuned grid circuit 13, a tuned plate circuit 28, and an oscillation circuit 42. The grid circuit includes the inductance 15 and the variable condenser 17 and is inductively coupled to the inductance 19, which may be the output inductance of a radio-frequency amplifier or the antenna inductance of the radio receiver. The grid circuit is connected to the grid and cathode, the latter connection being through the self-biasing resistor 23, which is shunted by the usual by-pass condenser 25. This resistor has, in addition to the usual function of producing the bias on the grid relative to the cathode, the function of regulating and limiting the plate voltage. The resistor is included not only in the grid circuit, but in the plate circuit, and thus an increase in the grid voltage, which might tend to overload the modulator, results in increased plate current and a change in the bias of the grid in the direction to reduce the plate current.

The plate circuit includes the tuned output circuit 28, which is connected to the high potential source 49, shunted by the radio-frequency by-pass condenser 41.

For exciting the oscillation circuit 42, it is coupled through adjustable condenser 36 to the plate circuit. The coupling between the plate and oscillation circuits is of the uniform-gain type, which has just been described in connection with Fig. 1 and therefore the description of this arrangement will not be repeated here.

The oscillation circuit 42 is directly connected to an auxiliary grid of the oscillator-modulator tube 11, as shown, which arrangement serves to impress an oscillation voltage upon this grid of the oscillation frequency This varying voltage serves to effect the plate impedance of the tube and thereby modulates the signal current impressed through the tuned circuit 13 on the tube 11.

The uniform-gain characteristics of the oscillation circuit are useful in this arrangement in preventing the plate current from varying to such an extent as to cause distortion or overload the plate circuit.

The condensers 35, 36, 37 and 39 are each made adjustable. Condensers 35 and 37 are adjusted to tune the circuits 28 and 33 to the intermediate frequency; condenser 39 is made adjustable to permit the circuits 13 and 42 to be aligned as described above in connection with Fig. 1, and the condenser 36 is adjustable to regulate properly the excitation of the oscillation circuit. It can thus be seen that there have been described two circuits which accomplish a similar result in preventing the overloading of the modulator and in obtaining substantially uniform translation gain throughout the entire tuning range of a receiver.

The specific constants of the circuits above described do not constitute any part of the present invention. These constants are variable within limits to accomplish the results indicated above.

It is to be understood that whereas the oscillator modulator embodying this invention is primarily for the purpose of superheterodyne radio receivers in which the grid circuit is coupled to the input of a radio receiver or the output of a radio-frequency amplifier tube and the plate circuit of the oscillator modulator is coupled to an intermediate-frequency tuned circuit, the oscillator modulator described may be utilized in any other suitable connection, and its use, therefore, in a superheterodyne is not to be construed as a limitation of the invention.

Furthermore, whereas the above-noted improvements have been found especially useful in radio-frequency circuits, it is to be understood that the principles involved are equally applicable for use in connection with vacuum tube circuits operating at any desired frequency. Also, the principles involved may be useful in connection with heterodyne, self-heterodyne or autodyne methods of receiving radio-frequency signals in which the oscillator modulator produces an audio beat. Similarly, the elements constituting the present invention may be utilized in connection with a homodyne or zero beat receiver. Oscillators of this type may be readily synchronized when tuned approximately to a master oscillator or to a harmonic of a master oscillator.

What is claimed is:

1. An oscillator-modulator circuit including a tube having input electrodes including a common electrode, and output electrodes including said common electrode, a tunable circuit connected to one of said input electrodes and adapted to respond to the frequency of currents which it is desired to modulate, an inductance connected between said tunable circuit and said common electrode, a grid condenser connected between said tunable circuit and one of said input electrodes and a grid-leak connected effectively between said input electrodes, an oscillation circuit tuned to respond to a frequency differing from that of the first-mentioned circuit by a fixed amount and including an inductance, inductively related to said first-mentioned inductance, and a coupling between said oscillation circuit and an output electrode of said tube, whereby the currents of the frequency to which said tunable circuit responds are modulated by the currents produced by said oscillation circuit.

2. An oscillator-modulator circuit including a tube having input electrodes including a common electrode and output electrodes including said common electrode, a tunable circuit connected to one of said input electrodes and adapted to respond to the frequency of currents which it is desired to modulate, an inductance connected between said tunable circuit and said common electrode, a grid condenser connected between said tunable circuit and one of said input electrodes and a grid-leak connected effectively between said input electrodes, an oscillation circuit tuned to respond to a frequency differing from that of the first-mentioned circuit by a fixed amount and including an inductance, inductively related to said first-mentioned inductance, a coupling between said oscillation circuit and an output electrode of said tube, whereby the currents of the frequency to which said tuned circuit responds are modulated by the currents produced by said oscillation circuit, and an output circuit also connected to an output electrode and tuned to respond to the difference between the frequencies of said tunable circuit and said oscillation circuit.

3. An oscillator-modulator circuit including a tube having input electrodes including a common electrode, and output electrodes including said common electrode, a tunable circuit including a variable condenser connected to one of said input electrodes, an inductance connected between said tunable circuit and said common electrode, an oscillation circuit including an inductance and a variable condenser, said last-mentioned inductance being inductively related to said first-mentioned inductance, a coupling between said oscillation circuit and an output electrode, a tuned output circuit connected to an output electrode and tuned to the frequency difference between said tunable circuit and said oscillation circuit, means for simultaneously tuning said tunable circuit and said oscillation circuit, and means for permitting a constant frequency difference to be maintained between said circuits as they are simultaneously tuned.

4. An oscillator-modulator circuit including a tube having input electrodes including a common electrode, and output electrodes including said common electrode, a tunable circuit including an inductance and a variable condenser connected to one of said input electrodes, an inductance connected between said tunable circuit and said common electrode, an oscillation circuit including a portion of a third inductance and a variable condenser, said last-mentioned inductance being inductively related to said first-mentioned inductance, a coupling between said oscillation circuit and an output electrode, a tuned output circuit connected to an output electrode and tuned to the frequency difference between said tunable circuit and said oscillation circuit, means for simultaneously tuning said tunable circuit and said oscillation circuit, and means for maintaining a constant frequency difference between said circuits as they are simultaneously tuned, said last-mentioned means including a condenser connected to a tap on said third-mentioned inductance and to said common electrode through said second-mentioned inductance.

5. An oscillator-modulator circuit including a tube having cathode, anode and two or more grid electrodes, a tuned circuit including an inductance and a variable condenser connected between said cathode and one of said grid electrodes, an oscillation circuit including an inductance and a variable condenser connected to another of said grid electrodes and coupled to said anode, and means for simultaneously tuning said tuned circuit and said oscillation circuit, whereby a substantially constant difference frequency is maintained between the frequency to which said tuned input circuit responds and that to which said oscillation circuit responds as said tube oscillates between anode and one of said grid electrodes and thus modulates currents of the frequency to which said input circuit is tuned, by the oscillation frequency.

6. An oscillator-modulator circuit including a thermionic tube having input electrodes, output electrodes, and a screen electrode, a tuned circuit including an inductance and a variable condenser connected to an input electrode, an oscillation circuit including an inductance and a variable condenser connected to said screen electrode and coupled to an output electrode, means for simultaneously tuning said tuned circuit and said oscillation circuit, whereby a substantially constant difference frequency is maintained between the frequency to which said tuned input circuit responds and that to which said oscillation circuit responds as said tube oscillates between the output and screen electrodes and thus modulates currents of the frequency to which said input circuit is tuned by the oscillation frequency, and a second tuned circuit connected to said output electrode and tuned to the difference between the frequencies to which said input and oscillation circuits respond.

7. An oscillator-modulator circuit including a thermionic tube having input electrodes, output electrodes, and a screen electrode, a tuned circuit including an inductance and a variable condenser connected to an input electrode, an oscillation circuit including an inductance and a variable condenser connected to said screen electrode and coupled to an output electrode, means for simultaneously tuning said tuned circuit and said oscillation circuit, whereby a substantially constant difference frequency is maintained between the frequency to which said tuned input circuit responds and that to which said oscillation circuit responds as said tube oscillates between the output and screen electrodes and thus modulates currents of the frequency to which said input circuit is tuned by the oscillation frequency, a second tuned circuit connected to an output electrode and tuned to the difference between the frequencies to which said input and oscillation circuits respond, and means for simultaneously permitting said input and oscillation circuits to respond to frequencies differing from each other by a substantially fixed amount and providing dual couplings between said output electrode and said oscillation circuit.

8. An oscillator system tunable over a frequency range, comprising a vacuum tube having at least three electrodes, a connection between one of said electrodes and ground, a main coil having one end coupled to another of said electrodes, a variable tuning condenser connected between ground and the other end of said main coil, a fixed coupling condenser connected between ground and an intermediate point on said coil, and an auxiliary coil coupled to said main coil and connected between ground and a third of said electrodes.

9. An oscillator system tunable over a frequency range, comprising a vacuum tube having a cathode and at least two other electrodes, a connection between one of said electrodes and ground, a main coil having one end coupled to another of said electrodes, a variable tuning condenser connected between ground and the other end of said main coil, a fixed coupling condenser connected between ground and an intermediate point on said coil, and a auxiliary coil coupled to said main coil and connected between ground and said cathode.

10. An oscillator system tunable over a frequency range, comprising a vacuum tube having an input electrode, output electrodes, and a common electrode, a connection between said input electrode and ground, a main coil having one end coupled to one of said output electrodes, a variable tuning condenser connected between ground and the other end of said main coil, a fixed condenser connected between ground and an intermediate point on said coil, and an auxiliary coil coupled to said main coil and connected between ground and said common electrode.

11. An oscillator system tunable over a frequency range, comprising a vacuum tube having cathode, grid and at least one other electrode, a connection between said grid and ground, a main coil having one end coupled to said other electrode, a variable tuning condenser connected between ground and the other end of said main coil, a fixed condenser connected between ground and an intermediate point on said coil, and an auxiliary coil coupled to said main coil and connected between ground and said cathode.

12. An oscillator system tunable over a frequency range, comprising a vacuum tube having cathode, grid, screen and plate electrodes, a connection between said grid and ground, a path between one of said screen and plate electrodes and ground of negligible impedance to currents of frequencies within said range, a main coil having one end coupled to the other of said screen and plate electrodes, a variable tuning condenser connected between ground and the other end of said main coil, a fixed coupling condenser connected between ground and an intermediate point on said coil, and an auxiliary coil coupled to said main coil and connected between ground and said cathode.

13. An oscillator system tunable over a frequency range, comprising a vacuum tube having cathode, grid and at least one other electrode, a connection between said grid and ground, a main coil having two sections conductively connected and electromagnetically coupled together, one end of said main coil being coupled to said other electrode, a variable tuning condenser connected between ground and the other end of said main coil, a fixed coupling connected between ground and the point between said main coil sections, and an auxiliary coil coupled to said main coil and connected between ground and said cathode, said coupling condenser and the section of the main coil coupled to said other electrode being proportioned to maintain a predetermined relation between amplitude and frequency of the oscillations.

14. In a combined oscillator modulator, an electron discharge tube having a plurality of electrodes, a tunable oscillation circuit, tunable input and tuned output circuits connected to said electrodes, a dual coupling from one of said electrodes to said oscillation circuit, said coupling including one portion, the reactance of which increases with frequency, and a second portion, the reactance of which decreases with frequency by a substantially corresponding amount, whereby a substantially uniform amplitude of oscillations is obtained, and a coupling between said oscillation circuit and an input electrode of said device.

15. An oscillator system tunable over a frequency range, comprising a vacuum tube having cathode, grid and at least one other electrode, a main coil having one end coupled to said other electrode, a variable tuning condenser connected between ground and the other end of said main coil, a fixed condenser connected between ground and an intermediate point on said coil, an auxiliary coil coupled to said main coil and connected between ground and said cathode, and a tuned circuit connected between said grid and ground and tuned to a frequency differing from the frequency of the oscillations produced by said oscillator, by a fixed amount.

16. An oscillator system tunable over a frequency range, comprising a vacuum tube having cathode, grid and at least two other electrodes, a main coil having one end coupled to one of said other electrodes, a variable tuning condenser connected between ground and the other end of said main coil, a fixed condenser connected between ground and an intermediate point on said coil, an auxiliary coil coupled to said main coil and connected between ground and said cathode, a tuned circuit connected between said grid and ground and tuned to a frequency differing from the frequency of the oscillations produced by said oscillator, by a fixed amount, and a tuned output circuit connected to one of said other electrodes and tuned to the fixed difference frequency.

17. An oscillator system tunable over a frequency range, comprising a vacuum tube having cathode, grid and at least one other electrode, a main coil having one end coupled to said other electrode, a variable tuning condenser connected between ground and the other end of said main coil, a fixed condenser connected between ground and an intermediate point on said coil, an auxiliary coil coupled to said main coil and connected between ground and said cathode, a tuned circuit connected between said grid and ground and tuned to a frequency differing from the frequency of the oscillations produced by said oscillator, by a fixed amount, and means for simultaneously tuning both of said circuits.

18. An oscillator system tunable over a frequency range, comprising a vacuum tube having cathode, grid and at least two other electrodes, a main coil having one end coupled to one of said other electrodes, a variable tuning condenser connected between ground and the other end of said main coil, a fixed condenser connected between ground and an intermediate point on said coil, an auxiliary coil coupled to said main coil and connected between ground and said cathode, a tuned circuit connected between said grid and ground and tuned to a frequency differing from the frequency of the oscillations produced by said oscillator, by a fixed amount, means for simultaneously tuning both of said circuits, and a tuned output circuit connected to one of said other electrodes and permanently tuned to the fixed difference frequency.

19. In a superheterodyne receiver, an oscillator-modulator circuit including an electron discharge tube having input and output electrodes, an input circuit for said device tunable to respond to any frequency within a frequency band, an oscillation circuit including a fixed condenser and tunable to respond to a frequency differing from the frequency to which said input circuit is tuned, by a substantially constant amount, simultaneous actuating means for tuning both of said circuits, a coupling between an output electrode of said tube and said oscillation circuit, said coupling including a fixed condenser of said circuit which assists in the alignment of said circuit with said input circuit as said circuits are tuned throughout the frequency band.

20. In a superheterodyne receiver, an oscillator-modulator arrangement comprising a thermionic tube having input and output electrodes, a tuned input circuit connected to one of said input electrodes and having a variable condenser for varying the frequency to which said circuit is tuned, an oscillation circuit coupled to one of the output electrodes of said device and connected to said input circuit, said oscillation circuit including a variable condenser for varying the frequency of the oscillations of said circuit throughout a range of frequencies, means for simultaneously varying both of said condensers, a fixed series condenser in said oscillation circuit for causing the frequency of the current produced thereby to differ from the frequency of said input circuit by a substantially constant amount as said circuits are simultaneously tuned, and a dual coupling between the output of said thermionic device and said oscillation circuit, said coupling including an inductive coupling and said series condenser, and said couplings being so arranged that the voltage produced by said circuit is substantially uniform throughout the range of frequencies.

21. In a superheterodyne receiver, an oscillator-modulator arrangement comprising a thermionic tube having input, output, and common electrodes, a tuned input circuit for said tube including a variable condenser, an oscillation circuit also including a variable condenser, means for simultaneously operating both of said variable condensers to simultaneously tune said circuits, a fixed condenser included in said oscillation circuit for permitting a constant frequency difference to be maintained between the frequencies to which said circuits are tuned as the condensers are simultaneously adjusted, a dual coupling between an output electrode of said device and said oscillation circuit, said coupling including an electromagnetic coupling and said fixed condenser, said couplings being so disposed that said oscillation circuit has a substantially constant voltage output as it is tuned through the frequency band, and an inductive coupling between said oscillation circuit and said common electrode.

DANIEL E. HARNETT.